(12) United States Patent
Yoshino

(10) Patent No.: US 10,502,768 B2
(45) Date of Patent: Dec. 10, 2019

(54) CURRENT DETECTION CIRCUIT

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Hiroshi Yoshino, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/118,150

(22) Filed: Aug. 30, 2018

(65) Prior Publication Data
US 2019/0242929 A1 Aug. 8, 2019

(30) Foreign Application Priority Data
Feb. 6, 2018 (JP) .................... 2018-018737

(51) Int. Cl.
*H03F 3/45* (2006.01)
*G01R 19/00* (2006.01)
*H02P 29/00* (2016.01)

(52) U.S. Cl.
CPC .......... *G01R 19/0092* (2013.01); *H02P 29/00* (2013.01); *H03F 3/45183* (2013.01); *H03F 2200/126* (2013.01); *H03F 2200/129* (2013.01); *H03F 2200/156* (2013.01); *H03F 2200/267* (2013.01); *H03F 2200/301* (2013.01); *H03F 2200/366* (2013.01); *H03F 2200/462* (2013.01); *H03F 2203/45116* (2013.01);
(Continued)

(58) Field of Classification Search
CPC ............................ H03F 3/45183; H02P 29/00
See application file for complete search history.

(56) References Cited

U.S. PATENT DOCUMENTS 4,366,444 A * 12/1982 Schade, Jr. ............. H03F 1/301
330/253
5,259,326 A * 11/1993 Borgman ................. A47B 9/00
108/147
(Continued)

FOREIGN PATENT DOCUMENTS

JP 4541358 B2 9/2010
JP 2011223309 A 11/2011
(Continued)

*Primary Examiner* — Muhammad S Islam
(74) *Attorney, Agent, or Firm* — Holtz, Holtz & Volek PC

(57) ABSTRACT

A current detection circuit has a differential amplification circuit that outputs a differential output current dependent on a voltage difference between input terminals and first and second feedback circuits that output a detection current in response to the differential output current and form a feedback path to each input terminal of the differential amplification circuit. First and second MOS transistors that generate voltages dependent on respective source-drain voltages at a time when drain currents in a forward direction and a backward direction flow through an output MOS transistor are connected to respective input terminals of the differential amplification circuit.

20 Claims, 8 Drawing Sheets

(52) U.S. Cl.
CPC ............ *H03F 2203/45512* (2013.01); *H03F 2203/45518* (2013.01); *H03F 2203/45534* (2013.01)

(56) References Cited

U.S. PATENT DOCUMENTS

| | | |
|---|---|---|
| 7,592,792 B2 | 9/2009 | Ryu et al. |
| 8,410,826 B2 | 4/2013 | Koto et al. |
| 2010/0327979 A1 | 12/2010 | Kanekawa et al. |

FOREIGN PATENT DOCUMENTS

| | | |
|---|---|---|
| JP | 2012182921 A | 9/2012 |
| JP | 5188465 B2 | 4/2013 |

* cited by examiner

CURRENT DETECTION CIRCUIT

CROSS-REFERENCE TO RELATED APPLICATION(S)

This application is based upon and claims the benefit of priority from Japanese Patent Application No. 2018-18737, filed on Feb. 6, 2018; the entire contents of which are incorporated herein by reference.

FIELD

The present embodiment generally relates to a current detection circuit.

BACKGROUND

A technique to detect a load current by using a source-drain voltage of a MOS transistor has been disclosed conventionally.

In a MOS transistor, a source-drain voltage differs depending on a direction of flowing of a drain current, even for an identical value thereof, due to its parasitic diode. Hence, a correspondence relationship between a voltage of a MOS transistor and a drain current is changed depending on a direction of a current so that linearity is not maintained. An attempt to switch a current detection circuit depending on a direction of a current that is supplied to a load has been executed but a configuration of such a current detection circuit is complicated and its cost is increased. A current detection circuit is desired that is capable of detecting a drain current readily and accurately even in a case where a direction of such a drain current that flows through a MOS transistor is changed.

DETAILED DESCRIPTION

According to one embodiment, a current detection circuit has a differential amplification circuit that includes first and second input terminals and outputs first and second differential output currents dependent on a voltage difference between the first and second input terminals. It has a first feedback circuit that outputs a first detection current in response to the first differential output current and forms a path to the second input terminal. It has a second feedback circuit that outputs a second detection current in response to the second differential output current and forms a path to the first input terminal. It has a first conductivity type first MOS transistor that generates, in a state where a drain current in a forward direction flows through a first conductivity type output MOS transistor that supplies an output current to a load, a voltage dependent on a source-drain voltage of the output MOS transistor, between a source of the output MOS transistor and the second input terminal. It has a first conductivity type second MOS transistor that generates, in a state where a drain current in a backward direction flows through the output MOS transistor, a voltage dependent on a source-drain voltage of the output MOS transistor, between a drain of the output MOS transistor and the first input terminal.

Hereinafter, a current detection circuit according to an embodiment will be explained in detail with reference to the accompanying drawings. Additionally, the present invention is not limited by such an embodiment.

First Embodiment

Figure 1:
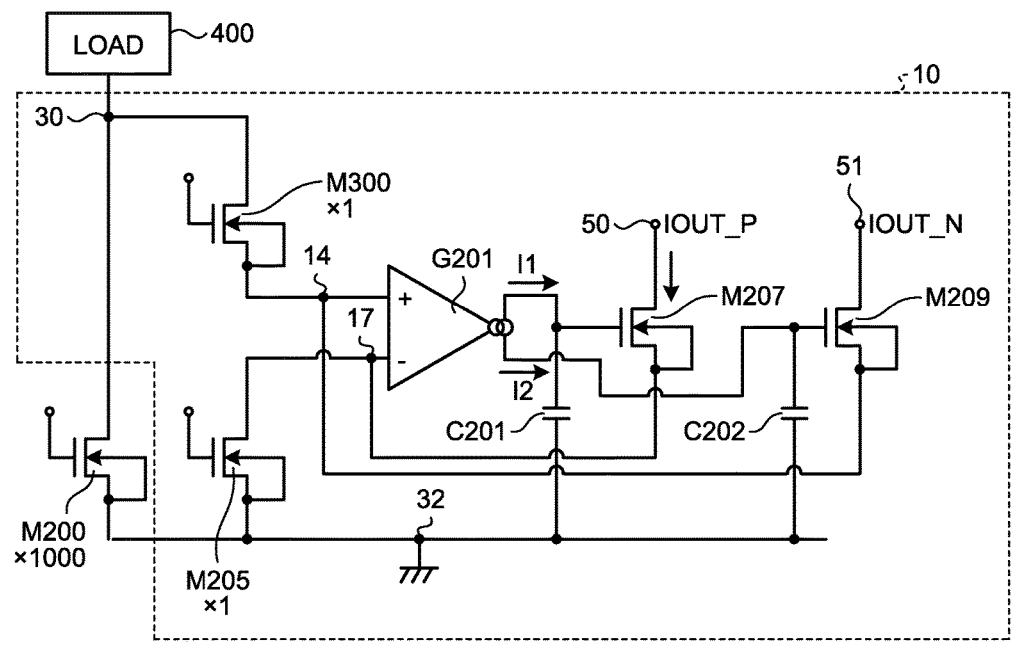
FIG. 1 is a diagram illustrating a configuration of a current detection circuit according to a first embodiment.

FIG. 1 is a configuration diagram of a current detection circuit according to a first embodiment. In the following respective embodiments, corresponding components will be provided with an identical sign to provide a duplicative description only in a case of need.

A current detection circuit 10 according to the present embodiment detects, for example, a drain current that flows through an NMOS output transistor M200. The NMOS transistor 200 is connected between a common connection terminal 30 and a ground terminal 32 and supplies an output current to a load 400 that is connected to the common connection terminal 30. The current detection circuit 10 has a differential amplification circuit G201 that has a non-inverting input terminal (+) and an inverting input terminal (−). The differential amplification circuit G201 outputs differential output currents I1, I2 dependent on a voltage difference that is applied between the non-inverting input terminal (+) and the inverting input terminal (−). The non-inverting input terminal (+) is connected to an input terminal 14 and the inverting input terminal (−) is connected to an input terminal 17.

It has an NMOS transistor M207 with a gate that is supplied with a first differential output current I1 of the differential amplification circuit G201. A source of the NMOS transistor M207 is connected to the input terminal 17 and its drain is connected to an output terminal 50. That is, the NMOS transistor M207 composes a feedback circuit that outputs a detection current IOUT_P from the output terminal 50 in response to a differential output current and forms a path to the inverting input terminal (−).

It has an NMOS transistor M205 between the input terminal 17 and the ground terminal 32. A source of the NMOS transistor M205 is connected to the ground terminal 32 and its drain is connected to the input terminal 17 and a source of the NMOS transistor M207. The NMOS transistor M205, together with the NMOS transistor M207, composes a source follower circuit.

It has a capacitor C201 between a gate of the NMOS transistor M207 and the ground terminal 32. A differential output current is supplied to the capacitor C201. The capacitor C201 is a capacitor for phase compensation and executes phase retardation compensation to prevent occurrence of oscillation.

A feedback path to the inverting input terminal (−) is formed by the NMOS transistor M207 so that the differential amplification circuit 201 executes an operation to equalize a voltage between the input terminal (+) and the input terminal (−). That is, when a state where a positive voltage is applied to a side of the non-inverting input terminal (+) and the NMOS transistor M207 is turned on is provided, an imaginary short (virtual short) state is provided between the non-inverting input terminal (+) and the inverting input terminal (−).

It has an NMOS transistor M209 with a gate that is supplied with a second differential output current I2. A source of the NMOS transistor M209 is connected to the input terminal 14 and its drain is connected to an output terminal 51. That is, the NMOS transistor M209 composes a feedback circuit that outputs a detection current IOUT_N from the output terminal 51 in response to a differential output current and forms a path to the non-inverting input terminal (+).

It has a capacitor C202 between a gate of the NMOS transistor M209 and the ground terminal 32. A differential output current is supplied to the capacitor C202. The capacitor C202 is a capacitor for phase compensation similarly to the capacitor C201.

It has an NMOS transistor M300 between the common connection terminal 30 and the input terminal 14. A drain of the NMOS transistor M300 is connected to the common connection terminal 30 and its source is connected to the input terminal 14.

Figure 2A:
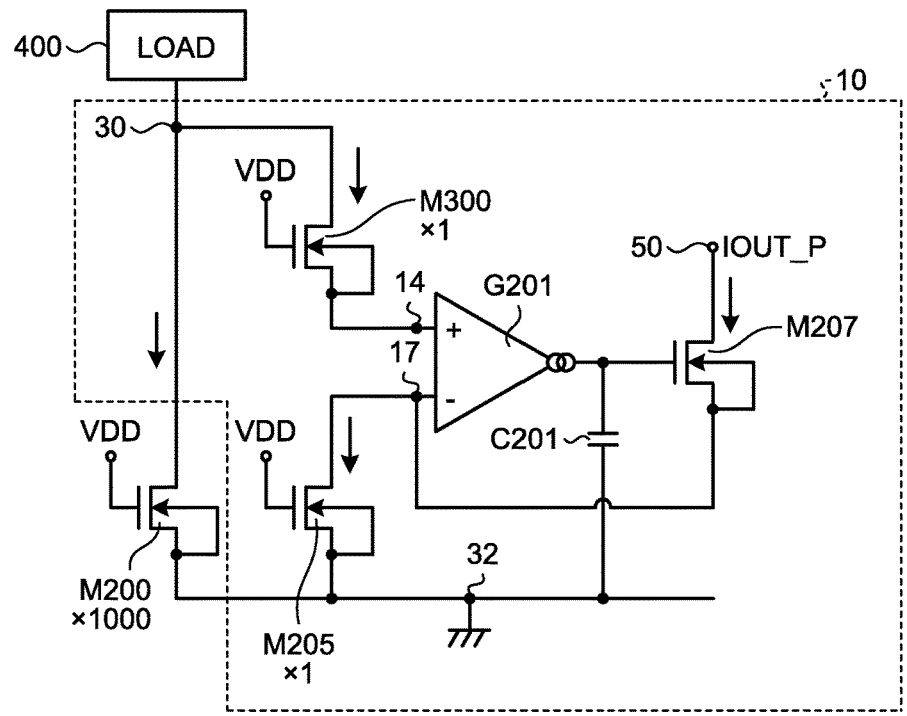
FIG. 2A and FIG. 2B are diagrams for explaining an operation of a current detection circuit according to a first embodiment.
Figure 2B:
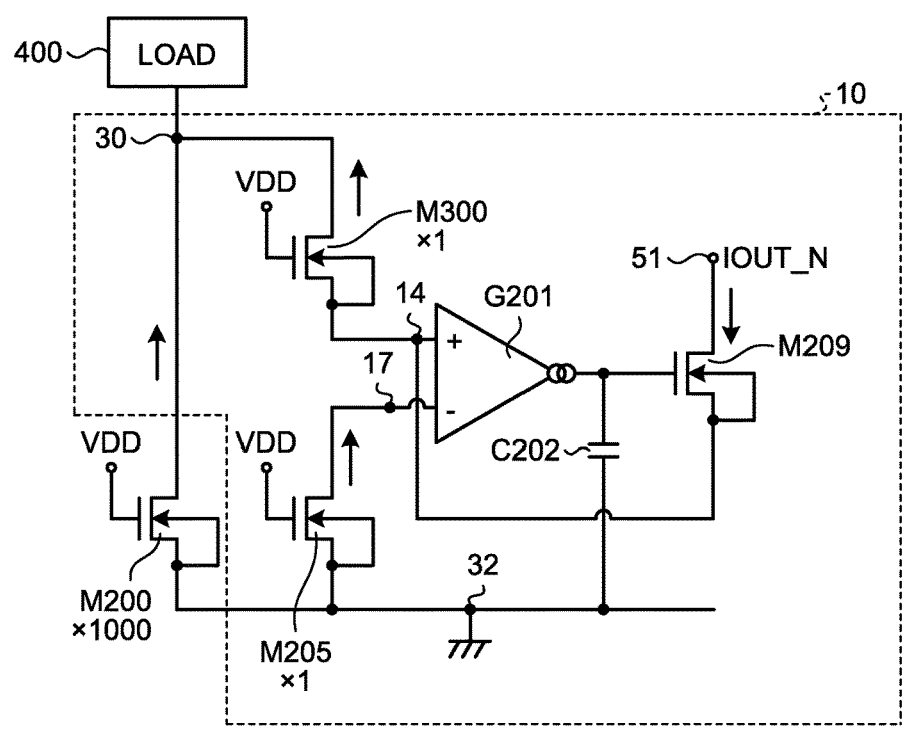

FIG. 2A and FIG. 2B are diagrams for explaining an operation of the current detection circuit 10 according to the first embodiment. FIG. 2A illustrates, for example, an operation in a case where a current is supplied from the load 400 and a drain current in a forward direction flows through the NMOS output transistor M200.

In a state where a drain current in a forward direction flows through the NMOS output transistor M200, a positive voltage is applied to a side of the non-inverting input terminal (+) of the differential amplification circuit G201 so that the NMOS transistor M207 is provided in an on-state by a differential output current. In such a case, the NMOS transistor M209 is turned off. Hence, FIG. 2A omits the NMOS transistor M209 and the capacitor C202.

A state where a power supply voltage VDD is applied to a gate of the NMOS transistor M300 so that the NMOS transistor M300 is turned on is illustrated. The power supply voltage VDD is applied to each of gates of the NMOS output transistor M200 and the NMOS transistor M205. Therefore, the NMOS transistor M205 and the NMOS output transistor M200 compose a current mirror circuit.

The NMOS transistor M207 composes a feedback circuit for the inverting input terminal (−) of the differential amplification circuit G201, so that an imaginary short (virtual short) is caused between the non-inverting input terminal (+) and the inverting input terminal (−).

A voltage at the inverting input terminal (−) is a source-drain voltage of the NMOS transistor M205. A voltage at the non-inverting input terminal (+) is a voltage provided by subtracting a source-drain voltage of the NMOS transistor M300 from a source-drain voltage of the NMOS output transistor M200. It is possible to ignore a current that is supplied to the non-inverting input terminal (+) through the NMOS transistor M300, so that it is possible to ignore a voltage drop that is caused by the NMOS transistor M300.

Therefore, a voltage that is equal to a source-drain voltage of the NMOS output transistor M200 is applied to the non-inverting input terminal (+).

As a result, a source-drain voltage of the NMOS output transistor M200 is applied to the non-inverting input terminal (+) and a source-drain voltage of the NMOS transistor M205 is applied to the inverting input terminal (−).

An imaginary short is caused between the non-inverting input terminal (+) and the inverting input terminal (−), so that a source-drain voltage of the NMOS transistor M205 is equal to a source-drain voltage of the NMOS output transistor M200.

A source-drain voltage of the NMOS transistor M205 is equal to that of the NMOS output transistor M200, so that the NMOS transistor M205 accurately outputs a drain current of the NMOS output transistor M200 depending on its dimension ratio to that of the NMOS output transistor M200. For example, a dimension of the NMOS transistor M205 is set so as to flow a drain current that is 1/N times a drain current of the NMOS output transistor M200 (where N is an arbitrary positive number that is greater than 1).

If a dimension ratio of the NMOS transistor M205 to the NMOS output transistor M200 is set at, for example, 1-to-1000, a drain current that is 1/1000 times that of the NMOS output transistor M200 flows through the NMOS transistor M205. In other words, it is possible to ignore a current that flows into the inverting input terminal (−), and hence, a drain current of the NMOS transistor M207 is detected so that it is possible to detect a current that is 1/1000 times a drain current of the NMOS output transistor M200.

Additionally, it is possible to recognize such a configuration of a detection operation as a configuration that generates a voltage that is equal to a source-drain voltage that is caused by a drain current in a forward direction at an on-resistance of the NMOS output transistor M200, as a source-drain voltage of the NMOS transistor M205, converts it into a current due to such an on-resistance of the NMOS transistor M205, and outputs it from the NMOS transistor M207 that composes a source follower circuit. It is possible to set a ratio of a current that is output from the NMOS transistor M207 to that of the NMOS output transistor M200, depending on a resistance ratio of the NMOS transistor M205 to the NMOS output transistor M200.

FIG. 2B illustrates, for example, a state where a current is supplied to the load 400 and a drain current in a backward direction flows through the NMOS output transistor M200.

In a state where a drain current in a backward direction flows through the NMOS output transistor M200, the NMOS transistor M209 is provided in an on-state by a differential output current. In such a case, the NMOS transistor M207 is turned off. Hence, FIG. 2B omits the NMOS transistor M207 and the capacitor C201.

A state where the power supply voltage VDD is applied to a gate of the NMOS transistor M300 so that the NMOS transistor M300 is turned on is illustrated. The NMOS transistor M209 forms a feedback path to the non-inverting input terminal (+), so that the differential amplification circuit G201 executes an operation to equalize a voltage between the non-inverting input terminal (+) and the inverting input terminal (−). That is, an imaginary short state is provided between the non-inverting input terminal (+) and the inverting input terminal (−).

A voltage at the inverting input terminal (−) is a source-drain voltage of the NMOS transistor M205. It is possible to ignore a current that flows through the NMOS transistor M205, so that the inverting input terminal (−) is virtual ground. An imaginary short is caused between the non-inverting input terminal (+) and the inverting input terminal (−), so that an electric potential at the non-inverting input terminal (+) is a ground potential. Hence, the NMOS output transistor M200 and the NMOS transistor M300 substantially compose a current mirror circuit where the power supply voltage VDD is applied to a gate thereof.

Sources of the NMOS output transistor M200 and the NMOS transistor M300 are substantially a common connection and their drains are also commonly connected, so that a source-drain voltage of the NMOS transistor M300 is equal to a source-drain voltage of the NMOS output transistor M200.

A source-drain voltage of the NMOS transistor M300 is equal to that of the NMOS output transistor M200, so that the NMOS transistor M300 accurately outputs a drain current of the NMOS output transistor M200 depending on its dimension ratio to that of the NMOS output transistor M200.

If a dimension ratio of the NMOS transistor M300 to the NMOS output transistor M200 is set at, for example, 1-to-1000, a drain current that is 1/1000 times that of the NMOS output transistor M200 flows through the NMOS transistor M300.

In other words, it is possible to ignore a current that flows into the non-inverting input terminal (+), and hence, a drain current of the NMOS transistor M209 is detected so that it is possible to detect a current that is 1/1000 times a drain current in a backward direction that flows through the NMOS output transistor M200.

Additionally, it is possible to recognize such a configuration of a detection operation as a configuration that generates a voltage that is equal to a source-drain voltage that is caused by a drain current in a backward direction at an on-resistance of the NMOS output transistor M200, as a source-drain voltage of the NMOS transistor M300, converts it into a current due to such an on-resistance of the NMOS transistor M300, and outputs it from the NMOS transistor M209 that composes a source follower circuit. It is possible to set a ratio of a current that is output from the NMOS transistor M209 to that of the NMOS output transistor M200, depending on a resistance ratio of the NMOS transistor M300 to the NMOS output transistor M200.

It is preferable to operate the NMOS output transistor M200 and the NMOS transistors M205 and M300 in a linear region. By operating in a linear region, setting of a current ratio dependent on a dimension ratio of the respective transistors M200, M205, and M300 is facilitated. For example, voltages that are applied to gates of the respective transistors M200, M205, and M300 are adjusted so that it is possible to operate the respective transistors M200, M205, and M300 in a linear region.

According to the present embodiment, it is possible to accurately detect drain currents in a forward direction and in a backward direction that flow through the NMOS output transistor M200, for example, at a current ratio of 1/1000. Furthermore, the differential amplification circuit G201 is commonly used for detection of both drain currents, so that a current detection circuit is simplified and it is possible to attain cost reduction.

For example, in a case where a drain current of the NMOS output transistor M200 is detected by using the NMOS transistors M300 and M205 at a current ratio of 1/1000, it is possible to reduce sizes of the NMOS transistors M300 and M205 depending on such a current ratio. Hence, reduction of a circuit size of the current detection circuit 10 is attained, so that it is possible to attain cost reduction.

Figure 3:
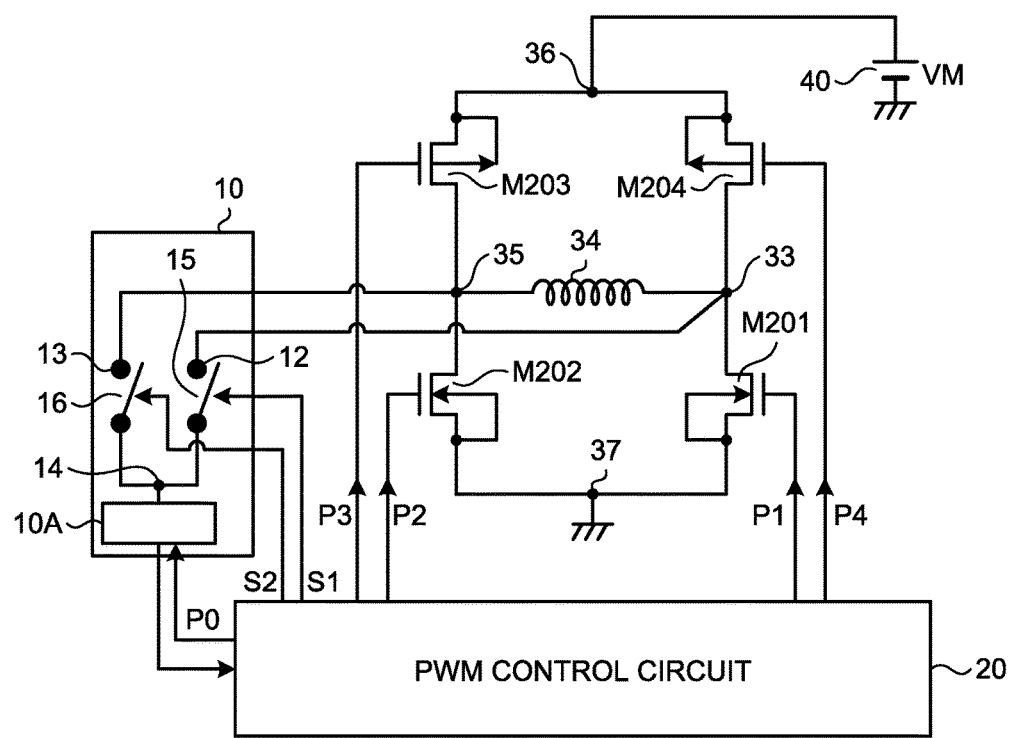
FIG. 3 is a diagram illustrating a configuration of a motor drive device with a current detection circuit being provided therein.

FIG. 3 is a configuration diagram of a motor drive device that is provided with the current detection circuit 10. The motor drive device has a power supply terminal 36 and a ground terminal 37. A power supply 40 that supplies a voltage VM is connected to the power supply terminal 36.

Source-drain paths of a PMOS output transistor M203 and an NMOS output transistor M202 are connected in series between the power supply terminal 36 and the ground terminal 37. Similarly, source-drain paths of a PMOS output transistor M204 and an NMOS output transistor M201 are connected in series.

An exciting coil 34 is connected between common connection points 35 and 33. A magnetic field that is generated by supplying an exciting current to the exciting coil 34 rotates a (non-illustrated) rotor of a motor. The NMOS output transistors M201 and M202 and the PMOS output transistors M203 and M204 compose an H switch that supplies an exciting current to the exciting coil 34.

The common connection points 33 and 35 are connected to the current detection circuit 10. The current detection circuit 10 includes a terminal 12 that is connected to the common connection point 33 and a terminal 13 that is connected to the common connection point 35. It has switches 15 and 16 that selectively connect the terminals 12 and 13 to the terminal 14. Switching of switches 15 and 16 is controlled by control signals S1 and S2 from a PWM control circuit 20. A basic configuration of the current detection circuit 10 is identical to the configuration of the first embodiment but has a configuration that switches the MOS transistors M201 and M202 that are targets for current detection. The terminal 14 is connected to an analog processing unit 10A. The analog processing unit 10A corresponds to, for example, a configuration that has the differential amplification circuit G201, the NMOS transistors M207 and M209, and the capacitors C201 and C202 as already described.

Information of a detection current of the current detection circuit 10 is supplied to the PWM control circuit 20. The PWM control circuit 20 supplies PWM signals P0-P4 that control on/off to the analog processing unit 10A and gates of the respective MOS output transistors M201-M204. The PWM control circuit 20 controls on-times of the respective MOS output transistors M201-M204 depending on information of a detection current of the current detection circuit 10 so that control to increase or decrease a value of a current that is supplied to the exciting coil 34 and thereby switch a drive mode of a (non-illustrated) motor is executed.

Figure 4A:
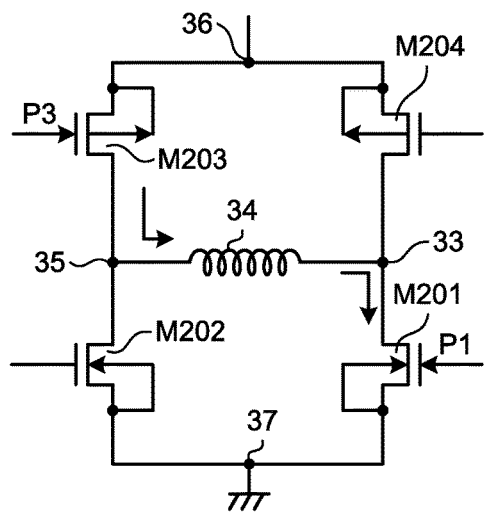
FIG. 4A and FIG. 4B are diagrams for explaining a relationship between an exciting current that flows through a motor drive device and a direction of a current that flows through an output MOS transistor.
Figure 4B:
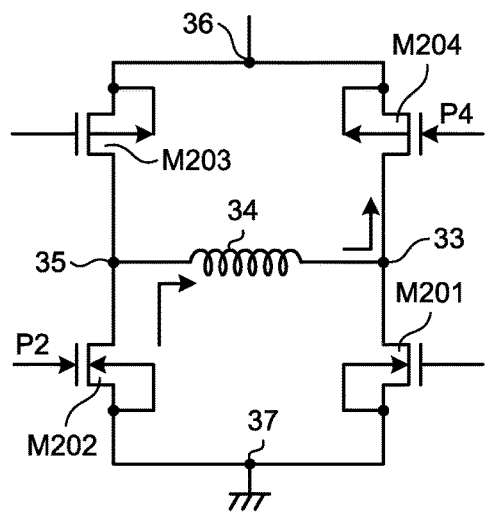

FIG. 4A and FIG. 4B are diagrams for explaining states of a current that flows through the motor drive device in FIG. 3. FIG. 4A illustrates a state where the PMOS output transistor M203 and the NMOS output transistor M201 are provided in on-states thereof so that a current flows from the power supply terminal 36 to the exciting coil 34 through the PMOS output transistor M203. For example, it is called a charge control state. In such a case, a drain current in a forward direction flows from a drain to a source of the NMOS output transistor M201.

FIG. 4B illustrates a state where the PMOS output transistor M204 and the NMOS output transistor M202 are provided in on-states thereof and a current flows from the ground terminal 37 to the exciting coil 34 through the NMOS output transistor M202. Such a state is a control state where energy that is stored in the exciting coil 34 is released, and for example, is called a discharge control state. In such a case, a drain current in a backward direction flows from a source to a drain of the NMOS output transistor M202.

The respective MOS output transistors M201-M204 have a configuration that connects a substrate to sources thereof. Hence, the respective MOS output transistors M201-M204 have (non-illustrated) parasitic diodes thereof. For example, a parasitic diode with an anode region that is a source and a cathode region that is a drain is connected in parallel to a source-drain path of each of the NMOS output transistors M201 and M202. Hence, in a state a current in a backward direction flows through each of the NMOS output transistors M201 and M202, such a parasitic diode forms a parallel current path.

Hence, source-drain voltages of the NMOS output transistors M201 and M202 are voltage that differ depending on a direction of a drain current even when a value of such a drain current is identical. Therefore, it is not possible to accurately detect an exciting current that flows as a load current in a case where only voltages that are generated by on-resistances of the NMOS output transistors M201 and M202 are monitored.

Second Embodiment

Figure 5:
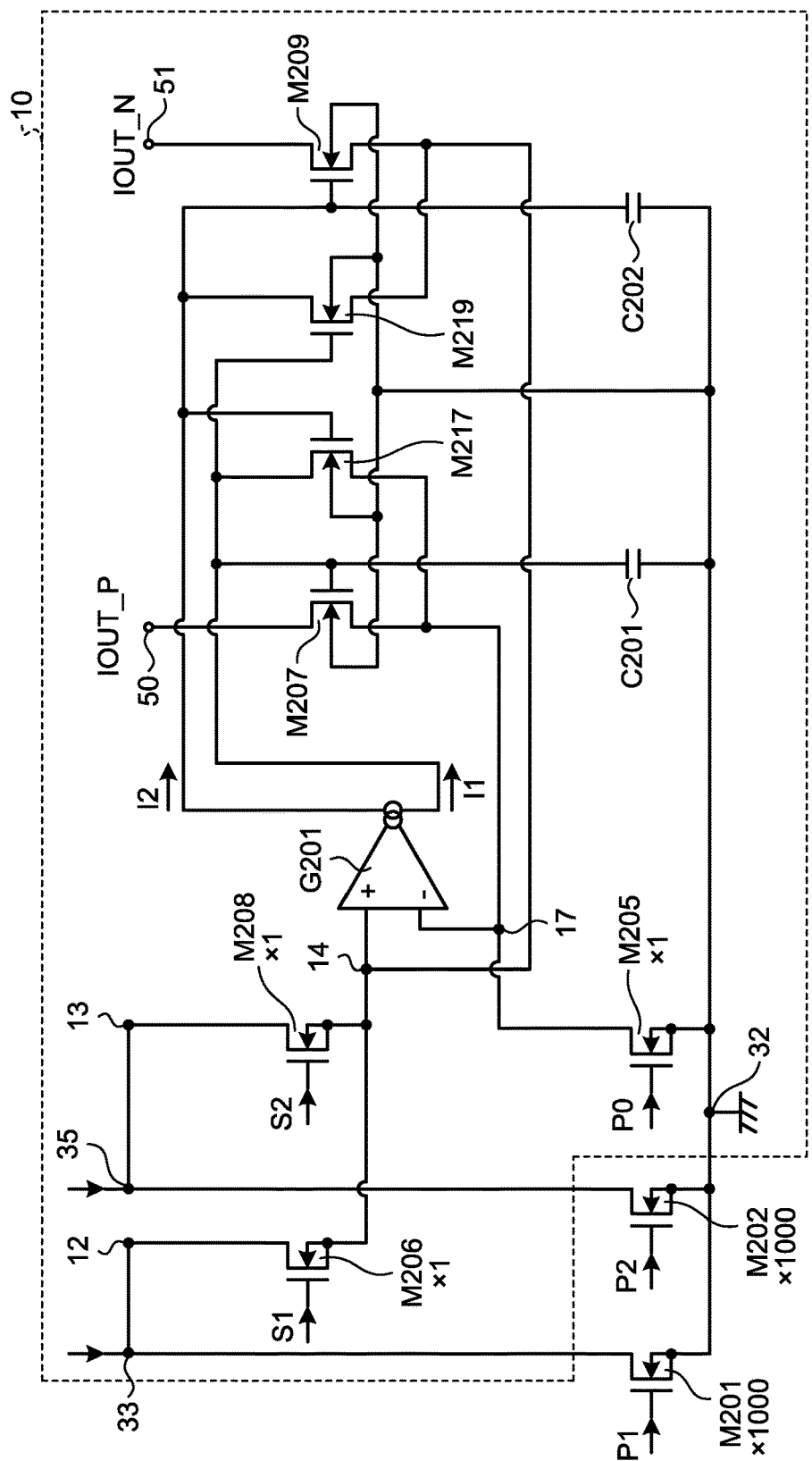
FIG. 5 is a diagram illustrating a configuration of a current detection circuit according to a second embodiment.

FIG. 5 is a configuration diagram of a current detection circuit according to a second embodiment. A current detection circuit 10 according to the present embodiment is a configuration that is capable of being used as the current detection circuit 10 as illustrated in FIG. 3 and is capable of detecting drain currents of the NMOS output transistors M201 and M202 in a motor drive device.

The current detection circuit 10 in FIG. 5 has the NMOS transistor M207 with a gate that is supplied with the differential output current I1 of the differential amplification circuit G201. A source of the NMOS transistor M207 is connected to the input terminal 17 that is connected to the inverting input terminal (−) of the differential amplification circuit G201. That is, the NMOS transistor M207 composes a feedback circuit that outputs the detection current IOUT_P in response to a differential output current and forms a path to the inverting input terminal (−).

It has an NMOS transistor M217 with a source-drain path that is connected between a gate and a source of the NMOS transistor M207. A gate of the NMOS transistor M217 receives supply of the differential output current I2 that is different from the differential output current I1 that is supplied to the NMOS transistor M207.

It has a capacitor C201 that is supplied with a differential output current. The capacitor C201 is a capacitor for phase compensation. Phase retardation compensation is applied to prevent occurrence of oscillation that is caused by a positive feedback state.

The current detection circuit 10 has the NMOS transistor M209 with a gate that is supplied with a differential output current. A source of the NMOS transistor M209 is connected to an input terminal 14 that is connected to the non-inverting input terminal (+) of the differential amplification circuit G201. That is, the NMOS transistor M209 composes a feedback circuit that outputs the detection current IOUT_N in response to a differential output current and forms a path to the non-inverting input terminal (+).

It has an NMOS transistor M219 with a source-drain path that is connected between a gate and a source of the NMOS transistor M209. A gate of the NMOS transistor M219 receives supply of the differential output current I1 that is different from the differential output current I2 that is supplied to the NMOS transistor M209.

It has a capacitor C202 that is supplied with a differential output current. The capacitor C202 is a capacitor for phase compensation. Phase retardation compensation is applied to prevent occurrence of oscillation that is caused by a positive feedback state.

A source-drain path of the NMOS transistor M205 is connected between the input terminal 17 and the ground terminal 32. A source-drain path of an NMOS transistor M206 is connected between the common connection terminal 33 and the input terminal 14. Furthermore, a source-drain path of an NMOS transistor M208 is connected between the common connection terminal 35 and the input terminal 14.

Substrate electrodes of the NMOS transistors M207, M209, M217, and M219 are grounded. Generation of current paths that are caused by (non-illustrated) parasitic diodes that are formed in a case of a configuration that connects sources and substrate electrodes of the NMOS transistors M217 and M219 is prevented to attain a stability of an operation.

In the present embodiment, gates of the respective NMOS output transistors M201 and M202 are supplied with control signals P1 and P2 from the PWM control circuit 20. For example, in a case of charge control, the NMOS transistor M201 is turned on by the control signal P1. In such a case, the NMOS transistor M206 where a control signal S1 is applied to a gate thereof is turned on.

By such control, the common connection terminal 33 is connected to the input terminal 14. In a configuration that detects a state where a current in a forward direction flows through the NMOS transistor M201, the NMOS transistor M206 serves as the switch 15 in FIG. 3.

In a case of a configuration that detects a current in a forward direction for the NMOS transistor M201, the NMOS output transistor M202 and M208 are provided in off-states thereof, by control signals P2 and S2. NMOS transistor M205 is turned on by a signal P0 in any of states where currents that flow through the NMOS output transistors M201 and M202 are detected.

In a state where a drain current in a forward direction flows through the NMOS output transistor M201, an operation as explained in a configuration as illustrated in FIG. 2A is executed. That is, the NMOS transistor M207 is turned on by the differential output current I1 to output the detection current IOUT_P. In a case of such an operation state, the NMOS output transistor M201 corresponds to the NMOS output transistor M200 in FIG. 2A.

The NMOS transistor M219 is also supplied with a differential output current so that the NMOS transistor M219 is turned on. Thereby, a gate and a source of the NMOS transistor M209 is shunted so that it is turned off.

In a state where a current in a backward direction flows through the NMOS output transistor M202, an operation as explained in a configuration as illustrated in FIG. 2B is executed. In a case of a configuration that detects a current in a backward direction of the NMOS output transistor M202, the NMOS output transistors M201 and M206 are provided in off-states thereof, by the control signals P1 and S1, and the NMOS transistor M208 is turned on by the control signal S2.

The NMOS transistor M209 is turned on by the differential output current I2 to output the detection current IOUT_N. In such an operation state, the NMOS output transistor M202 corresponds to the NMOS output transistor M200 in FIG. 2B.

In such a case, the NMOS transistor M217 is also supplied with a differential output current so that the NMOS transistor M217 is turned on. Thereby, a gate and a source of the NMOS transistor M207 is shunted so that it is turned off.

The present embodiment includes the NMMOS transistors M217 and M219 that shunt gates and sources of the NMOS transistors M207 and M209 that output the detection currents IOUT_P and IOUT_N. When switching between operations of the NMOS transistors M207 and M209, gates and sources of the NMOS transistors M207 and M209 are alternately shunted by the NMOS transistors M217 and M219, so that it is possible to execute an operation to switch between the NMOS transistors M207 and M209 reliably.

Substrate electrodes of the NMOS transistors M207, M209, M217, and M219 are grounded. Such substrate electrodes are grounded, and thereby, formation of current paths that is caused by parasitic diodes of the NMOS transistors M217 and M219 is prevented so that it is possible to stabilize a circuit operation.

Figure 6A:
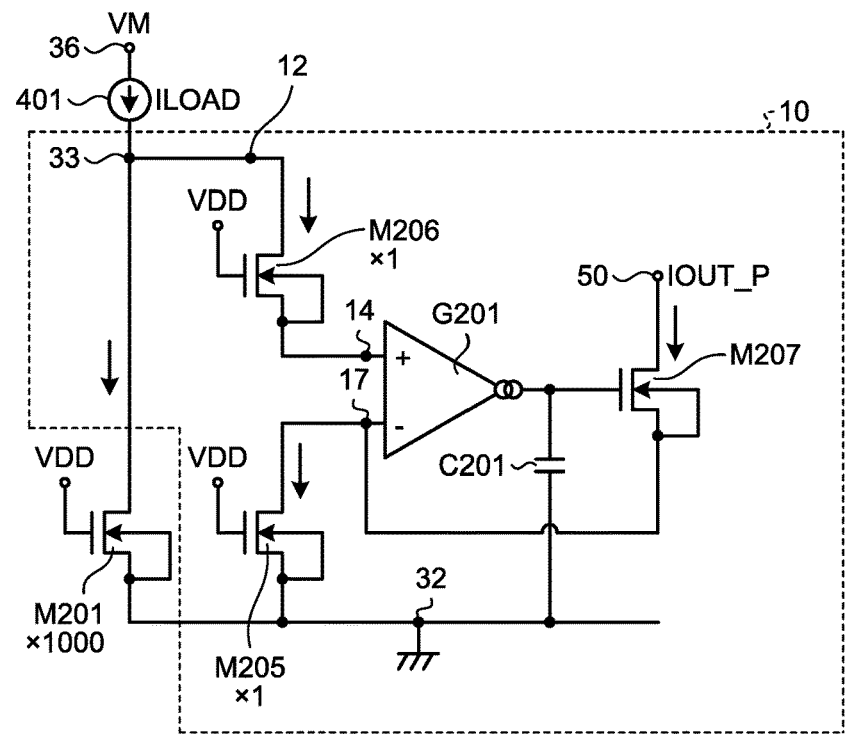
FIG. 6A and FIG. 6B are diagrams for explaining an operation of a current detection circuit according to a second embodiment.
Figure 6B:
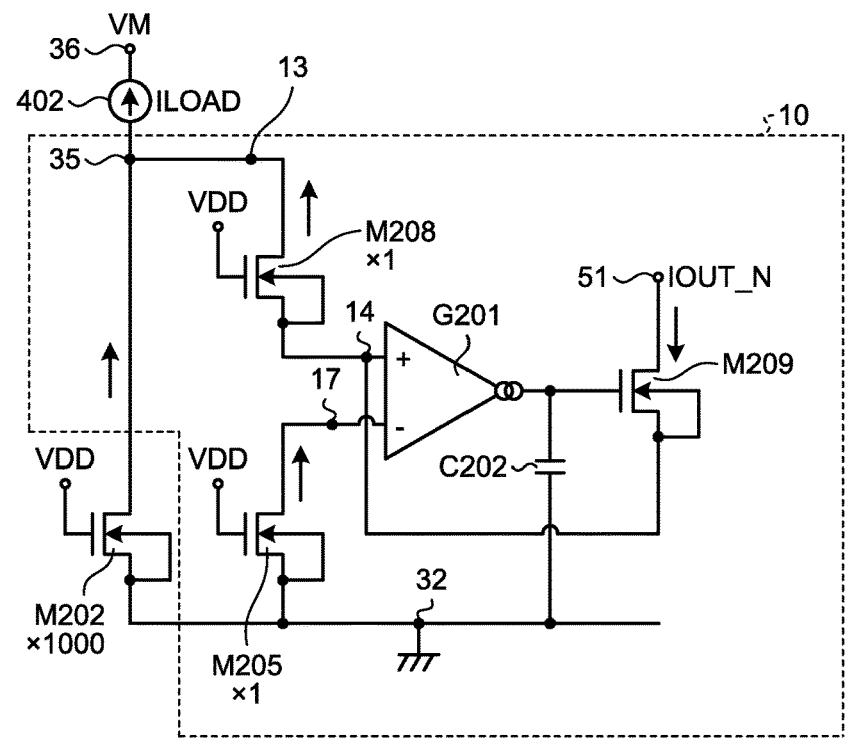

FIG. 6A and FIG. 6B are diagrams for explaining an operation of the current detection circuit 10 according to the second embodiment. FIG. 6A is a diagram for explaining an operation for current detection in a state where a drain current in a forward direction flows through the NMOS output transistor M201, that is, a charge control state. A load current ILOAD in a charge state is denoted by 401. The state is such that the NMOS transistor M206 that corresponds to the switch 15 in FIG. 3 is turned on by the control signal S1. Additionally, the power supply voltage VDD that is supplied to gates of the respective MOS transistors M201, M205, and M206 is supplied as control signals P1, P0, and S1.

In a state where a drain current in a forward direction flows through the NMOS output transistor M201, the NMOS transistor M206 is turned on to apply a positive voltage to a side of the non-inverting input terminal (+) and the NMOS transistor M207 is provided in an on-state thereof by a differential output current. Herein, the NMOS transistor M209 as illustrated in FIG. 5 is turned off, and hence, FIG. 6A omits the NMOS transistor M209, the NMOS transistor M219, and the capacitor C202.

Sources of the NMOS transistors M201 and M205 are commonly connected and the power supply voltage VDD is applied to their gates. Therefore, the NMOS output transistors M201 and M205 compose a current mirror circuit. Hence, drain currents flow through the NMOS output transistors M201 and M205 depending on their dimension ratio.

For example, in a case where a dimension ratio of the NMOS transistor M205 to the NMOS output transistor M200 is set at 1-to-1000, a drain current that is $\frac{1}{1000}$ times that of the NMOS output transistor M201 flows through the NMOS transistor M205. In other words, it is possible to ignore a current that flows into the differential amplification circuit G201, and hence, a drain current of the NMOS transistor M207 is detected so that it is possible to detect a current that is $\frac{1}{1000}$ times a drain current of the NMOS output transistor M201.

FIB. 6B is a diagram for explaining an operation to execute current detection in a state where a current in a backward direction flows through the NMOS output transistor M202, that is, a discharge control state. A load current ILOAD in a discharge state is denoted by 402. The state is such that the NMOS transistor M206 that corresponds to the switch 16 in FIG. 3 is turned on by the control signal S2. Additionally, the power supply voltage VDD that is supplied to gates of the respective transistors is supplied as control signals S2, P0, and P2.

A feedback circuit for the non-inverting input terminal (+) is formed by the NMOS transistor M209 that responds to a differential output current, so that the differential amplification circuit G201 executes an operation to equalize a voltage between the non-inverting input terminal (+) and the inverting input terminal (−). That is, an imaginary short state is provided between the non-inverting input terminal (+) and the inverting input terminal (−).

Hence, the NMOS output transistors M202 and M205 are configured in such a manner that their sources are substantially provided in a common connection state and the power supply voltage VDD is applied to their gates. Thereby, the NMOS output transistors M202 and M205 compose a current mirror circuit. Hence, drain currents flow through the NMOS transistors M202 and M205 depending on their dimension ratio.

For example, in a case where a dimension ratio of the NMOS transistor M205 to the NMOS output transistor M202 is set at 1-to-1000, a drain current that is $\frac{1}{1000}$ times that of the NMOS output transistor M202 flows through the NMOS transistor M205. In other words, it is possible to ignore a current that flows into the inverting input terminal (−), and hence, a drain current of the NMOS transistor M209 is detected so that it is possible to detect a current that is $\frac{1}{1000}$ times a drain current of the NMOS output transistor M202.

According to the present embodiment, switching between the NMOS output transistors M201 and M202 that are connected to the differential amplification circuit G201 is executed, so that it is possible to detect a drain current in a forward direction of the NMOS output transistor M201 and a drain current in a backward direction of the NMOS output transistor M202 from the NMOS transistors M207 and M209 that respond to a differential output current, as detection currents IOUT_P and IOUT_N, depending on a control state of a motor drive device.

The differential amplification circuit G201 is commonly used for current detection in both directions that are a forward direction and a backward direction. Hence, a configuration of a current detection circuit is simplified, so that it is possible to attain cost reduction. Furthermore, the common differential amplification circuit G201 is used, so that adjustment of an offset voltage is facilitated.

Figure 7:
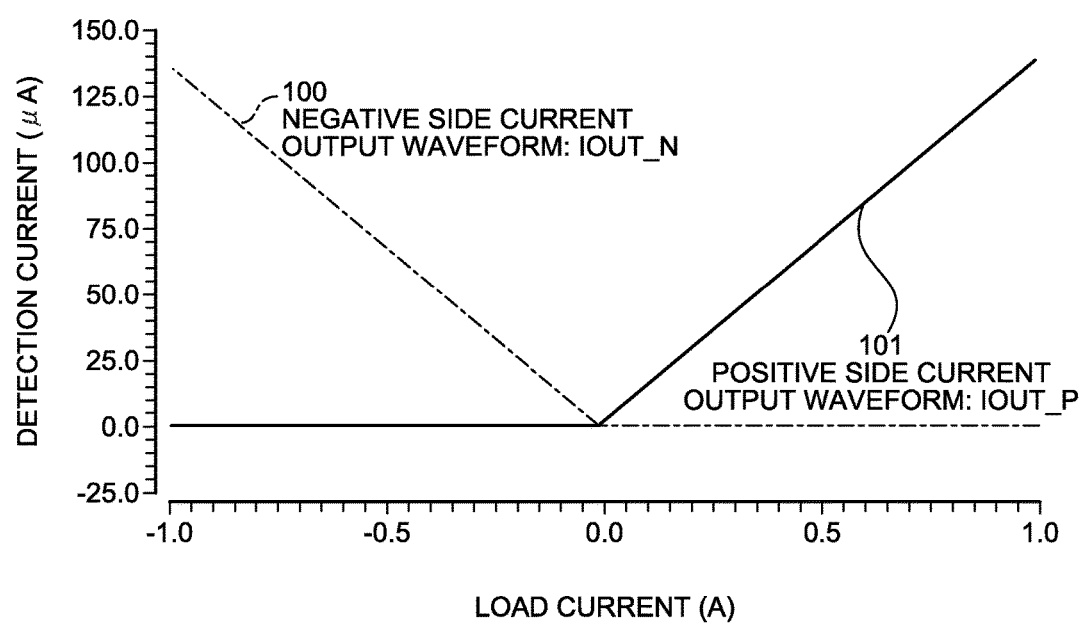
FIG. 7 is a diagram illustrating a result of simulation of a current detection circuit according to a second embodiment.

FIG. 7 is a diagram illustrating a result of simulation of the current detection circuit 10 according to the second embodiment. A horizontal axis indicates a load current and a vertical axis indicates a detection current. The detection current IOUT_N is indicated by a dashed-dotted line 100 and the detection current IOUT_P is indicated by a solid line 101.

The detection current transfers from IOUT_N to IOUT_P with a transfer from a state of a negative load current, that is, a state where a current in a backward direction flows through the NMOS output transistor M202, to a state of a positive load current, that is, a state where a current in a forward direction flows through the NMOS output transistor M201.

Third Embodiment

Figure 8:
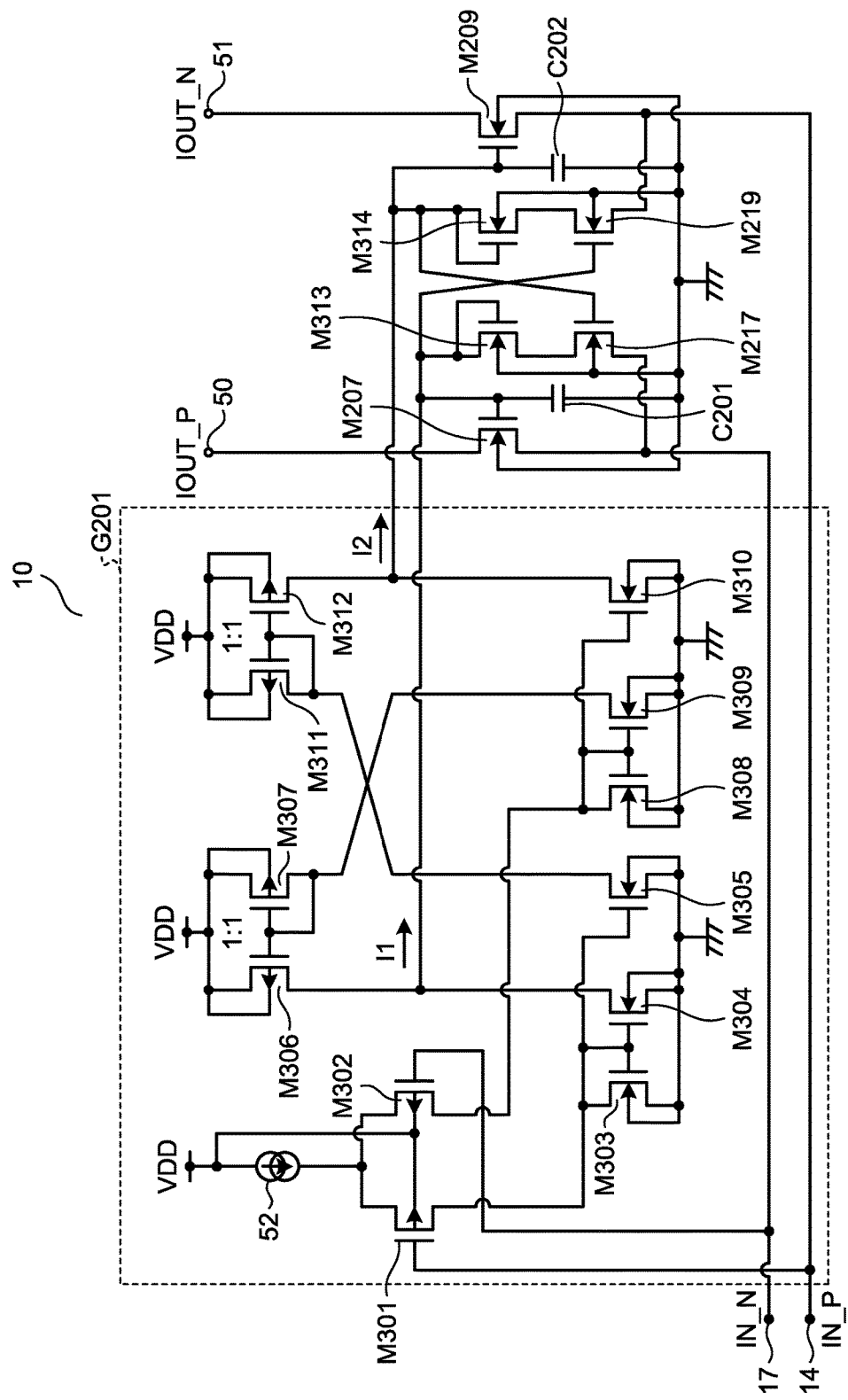
FIG. 8 is a diagram illustrating a configuration of a current detection circuit according to a third embodiment.

FIG. 8 is a configuration diagram of a current detection circuit according to a third embodiment. FIG. 8 omits the NMOS transistors M201, M202, M205, and M206 as illustrated in FIG. 5.

In the present embodiment, the differential amplification circuit G201 has PMOS transistors M301 and M302 that compose a differential pair. Sources of the PMOS transistors M301 and M302 are connected to a bias current source 52. A gate of the PMOS transistor M301 is connected to the input terminal 14 and a gate of the PMOS transistor M302 is connected to the input terminal 17. That is, a gate of the PMOS transistor M301 is a non-inverting input terminal (+) and a gate of the PMOS transistor M302 is an inverting input terminal (−).

A drain of the MPOS transistor M301 is connected to gates of NMOS transistors M303, M304, and M305.

Sources of the NMOS transistors M303-M305 are grounded. The NMOS transistors M303-M305 compose a current mirror circuit.

A drain of the PMOS transistor M302 is connected to gates of NMOS transistors M308, M309, and M310. Sources of the NMOS transistors M308-M310 are grounded. The NMOS transistors M308-M310 compose a current mirror circuit.

A drain of the NMOS transistor M305 is connected to a drain and a gate of a PMOS transistor M311. A gate of the PMOS transistor M311 is connected to a gate of a PMOS transistor M312 and the power supply voltage VDD is applied to sources of the PMOS transistors M311 and M312. The PMOS transistors M311 and M312 compose a current mirror circuit. A dimension ratio of the PMOS transistors M311 and M312 is set at 1:1. That is, a current that is equal to a drain current of the PMOS transistor M311 flows into a drain of the PMOS transistor M312.

A drain of the NMOS transistor M309 is connected to a drain and a gate of a PMOS transistor M307. A gate of a PMOS transistor M306 is connected to a gate of the PMOS transistor M307 and the power supply voltage VDD is applied to sources of the PMOS transistors M306 and M307. The PMOS transistors M306 and M307 compose a current mirror circuit. A dimension ratio of the PMOS transistors M306 and M307 is set at 1:1. That is, a current that is equal to a drain current of the PMOS transistor M307 flows into a drain of the PMOS transistor M306.

A current that is equal to a drain current of the PMOS transistor M301 flows through the NMOS transistor M304 and a current that is equal to a drain current of the PMOS transistor M302 flows through the PMOS transistor M306. Therefore, a current I1 that is output from a connection point between the NMOS transistor M304 and the PMOS transistor M306 is a difference current between drain currents of the PMOS transistors M301 and M302 and is provided as a first differential output current. In response to the current I1, the NMOS transistor M207 outputs the detection current IOUT_P that is positive when an electric potential at the non-inverting input terminal 14 is high.

A current that is equal to a drain current of the PMOS transistor M302 flows through the NMOS transistor M310 and a current that is equal to a drain current of the PMOS transistor M301 flows through the PMOS transistor M312. Therefore, a current I2 that is output from a connection point between the NMOS transistor M310 and the PMOS transistor M312 is a difference current between drain currents of the PMOS transistors M301 and M302 and is provided as a second differential output current. In response to the current I2, the NMOS transistor M209 outputs the detection current IOUT_N that is positive when an electric potential at the inverting input terminal 17 is high.

That is, the differential amplification circuit G201 outputs, and supplies to the NMOS transistors M207 and M209, the differential output currents I1 and I2 dependent on voltages that are supplied to the input terminals 14 and 17.

A diode-connected NMOS transistor M313 in addition to a source-drain path of the NMOS transistor M217 is connected between a gate and a source of the NMOS transistor M207. Similarly, a diode-connected NMOS transistor M314 in addition to a source-drain path of the NMOS transistor M219 is connected between a gate and a source of the NMOS transistor M209.

The NMOS transistors M313 and M314 provide constant bias voltages between gates and sources of the NMOS transistors M207 and M209, respectively. That is, in a state where the NMOS transistor M217 is turned on to shunt between a gate and a source thereof, the NMOS transistor M313 provides a constant bias voltage that is caused by a drop voltage in a forward direction (VF). Due to such a bias voltage, an idling current flows through the NMOS transistor M207. For example, an idling current of approximately 100 nA is set.

Similarly, in a state where the NMOS transistor M219 is turned on to shunt between a gate—a source thereof, the NMOS transistor M314 provides a constant bias voltage that is caused by a drop voltage in a forward direction (VF). Thereby, an idling current flows through the NMOS transistor M209.

A configuration that flows an idling current is provided so that responsiveness of the NMOS transistors M207 and M209 is improved and it is possible to smoothly execute a switching operation for the NMOS transistors M207 and M209 that output a detection current in response to a differential output current.

Figure 9:
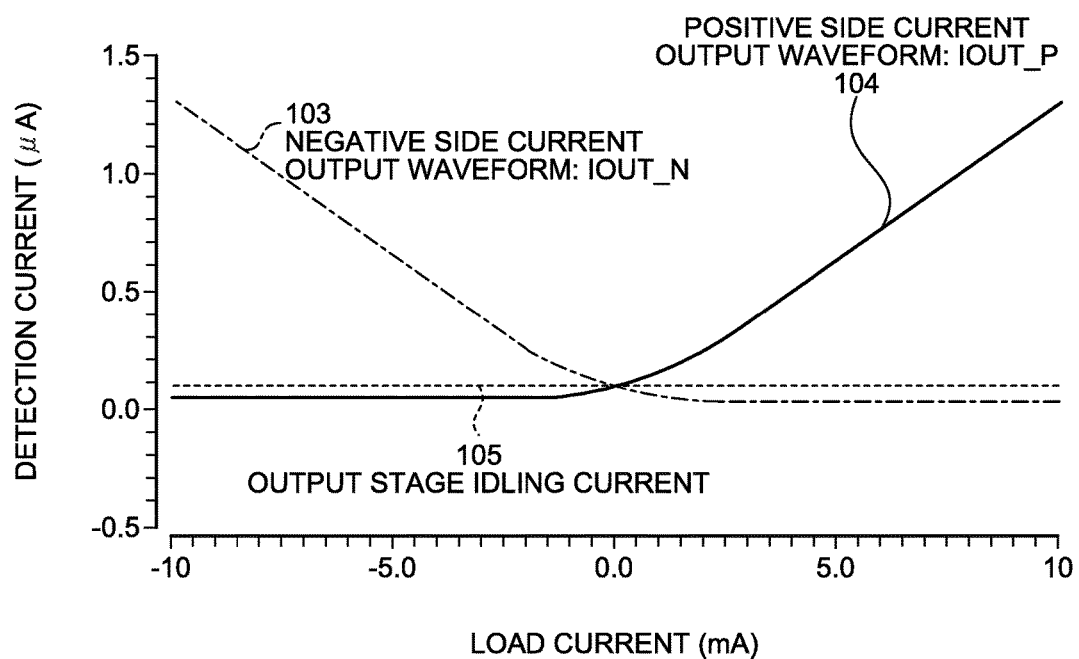
FIG. 9 is a diagram illustrating a result of simulation of a current detection circuit according to a third embodiment.

FIG. 9 is a diagram illustrating a result of simulation of the current detection circuit 10 according to the third embodiment. A horizontal axis indicates a load current and a vertical axis indicates a detection current. The detection current IOUT_N is indicated by a dashed-dotted line 103 and the detection current IOUT_P is indicated by a solid line 104. An idling current is indicated by a broken line 105.

The detection current transfers from IOUT_N to IOUT_P with a transfer from a state of a negative load current, that is, a state where a drain current in a backward direction flows through the NMOS output transistor M202 to a state of a positive load current, that is, a state where a drain current in a forward direction flows through the NMOS output transistor M201.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detection circuit, comprising:
 a differential amplification circuit that includes first and second input terminals and outputs first and second differential output currents dependent on a voltage difference between the first and second input terminals;
 a first feedback circuit that outputs a first detection current in response to the first differential output current and forms a path to the second input terminal;
 a second feedback circuit that outputs a second detection current in response to the second differential output current and forms a path to the first input terminal;
 a first MOS transistor that generates, in a state where a drain current in a forward direction flows through an output MOS transistor that supplies an output current to a load, a voltage dependent on a source-drain voltage of the output MOS transistor, between a source of the output MOS transistor and the second input terminal; and
 a second MOS transistor that generates, in a state where a drain current in a backward direction flows through the output MOS transistor, a voltage dependent on a source-drain voltage of the output MOS transistor, between a drain of the output MOS transistor and the first input terminal.

2. The current detection circuit according to claim 1, wherein the first and second MOS transistors flow a drain current that is 1/N times a drain current of the output MOS transistor, where N is an arbitrary positive number that is greater than 1.

3. The current detection circuit according to claim 1, wherein the first and second MOS transistors have a reduced size with respect to that of the output MOS transistor.

4. The current detection circuit according to claim 1, wherein:
the first feedback circuit includes a third MOS transistor that has a source that is connected to the second input terminal and a drain that outputs the first detection current; and
the second feedback circuit includes a fourth MOS transistor that has a source that is connected to the first input terminal and a drain that outputs the second detection current.

5. The current detection circuit according to claim 4, comprising:
a fifth MOS transistor with a source-drain path that is connected between a gate and a source of the third MOS transistor; and
a sixth MOS transistor with a source-drain path that is connected between a gate and a source of the fourth MOS transistor.

6. The current detection circuit according to claim 5, comprising:
a diode-connected seventh MOS transistor that is connected to a source-drain path of the fifth MOS transistor in series; and
a diode-connected eighth MOS transistor that is connected to a source-drain path of the sixth MOS transistor in series.

7. The current detection circuit according to claim 1, wherein the output MOS transistor supplies a current to an exciting coil of a motor.

8. A current detection circuit, comprising:
a first MOS transistor that supplies an output current to a load;
a second MOS transistor that supplies an output current to the load;
a differential amplification circuit that has first and second input terminals and outputs a differential output current dependent on a voltage difference between the first and second input terminals;
a third MOS transistor with a source that is connected to sources of the first and second MOS transistors and a drain that is connected to the second input terminal;
a fourth MOS transistor that connects a drain of the first MOS transistor to the first input terminal when the first MOS transistor is turned on;
a fifth MOS transistor that connects a drain of the second MOS transistor to the first input terminal when the second MOS transistor is turned on;
a first feedback circuit that outputs a first detection current in response to a differential output current at a time when the first MOS transistor is turned on and forms a path to the second input terminal; and
a second feedback circuit that outputs a second detection current in response to the differential output current at a time when the second MOS transistor is turned on and forms a path to the first input terminal.

9. The current detection circuit according to claim 8, wherein the third MOS transistor flows a drain current that is 1/N times drain currents of the first MOS transistor and the second MOS transistor, where N is an arbitrary positive number that is greater than 1.

10. The current detection circuit according to claim 8, wherein the third MOS transistor has a reduced size with respect to those of the first MOS transistor and the second MOS transistor.

11. The current detection circuit according to claim 8, wherein the load is an exciting coil of a motor.

12. The current detection circuit according to claim 10, wherein:
the first feedback circuit includes a sixth MOS transistor that has a source that is connected to the second input terminal and a drain that outputs the first detection current; and
the second feedback circuit includes a seventh MOS transistor that has a source that is connected to the first input terminal and a drain that outputs the second detection current.

13. The current detection circuit according to claim 12, comprising:
a eighth MOS transistor with a source-drain path that is connected between a gate and a source of the sixth MOS transistor; and
a ninth MOS transistor with a source-drain path that is connected between a gate and a source of the seventh MOS transistor.

14. The current detection circuit according to claim 13, comprising:
a diode-connected tenth MOS transistor that is connected to a source-drain path of the eighth MOS transistor in series; and
a diode-connected eleventh MOS transistor that is connected to a source-drain path of the ninth MOS transistor in series.

15. A current detection circuit, comprising:
a first MOS transistor with a drain that is connected to a first terminal of an exciting coil of a motor;
a second MOS transistor with a drain that is connected to a second terminal of the exciting coil;
a differential amplification circuit that has first and second input terminals and outputs a differential output current dependent on a voltage difference between the first and second input terminals;
a third MOS transistor with a source that is connected to sources of the first and second MOS transistors and a drain that is connected to the second input terminal;
a fourth MOS transistor that connects a drain of the first MOS transistor to the first input terminal when the first MOS transistor is turned on;
a fifth MOS transistor that connects a drain of the second MOS transistor to the first input terminal when the second MOS transistor is turned on;
a first feedback circuit that outputs a first detection current in response to the differential output current at a time when the first MOS transistor is turned on and forms a path to the second input terminal; and
a second feedback circuit that outputs a second detection current in response to the differential output current at a time when the second MOS transistor is turned on and forms a path to the first input terminal.

16. The current detection circuit according to claim 15, wherein the third MOS transistor flows a drain current that is 1/N times drain currents of the first MOS transistor and the second MOS transistor, where N is an arbitrary positive number that is greater than 1.

17. The current detection circuit according to claim 15, wherein the third MOS transistor has a reduced size with respect to those of the first MOS transistor and the second MOS transistor.

18. The current detection circuit according to claim 15, wherein:
  the first feedback circuit includes a sixth MOS transistor that has a source that is connected to the second input terminal and a drain that outputs the first detection current; and
  the second feedback circuit includes a seventh MOS transistor that has a source that is connected to the first input terminal and a drain that outputs the second detection current.

19. The current detection circuit according to claim 18, comprising:
  a eighth MOS transistor with a source-drain path that is connected between a gate and a source of the sixth MOS transistor; and
  a ninth MOS transistor with a source-drain path that is connected between a gate and a source of the seventh MOS transistor.

20. The current detection circuit according to claim 19, comprising:
  a diode-connected tenth MOS transistor that is connected to a source-drain path of the eighth MOS transistor in series; and
  a diode-connected eleventh MOS transistor that is connected to a source-drain path of the ninth MOS transistor in series.

* * * * *